(12) United States Patent
Mizutani et al.

(10) Patent No.: US 10,541,160 B2
(45) Date of Patent: Jan. 21, 2020

(54) SUBSTRATE CASE AND SUBSTRATE ACCOMMODATION APPARATUS

(75) Inventors: Hideo Mizutani, Yokohama (JP); Tohru Kiuchi, Tokyo (JP); Toru Kawaguchi, Kawasaki (JP); Takashi Masukawa, Yokohama (JP)

(73) Assignee: Nikon Corporation, Tokyo (JP)

( * ) Notice: Subject to any disclaimer, the term of this patent is extended or adjusted under 35 U.S.C. 154(b) by 1074 days.

(21) Appl. No.: 12/976,149

(22) Filed: Dec. 22, 2010

(65) Prior Publication Data

US 2011/0155838 A1 Jun. 30, 2011

Related U.S. Application Data

(60) Provisional application No. 61/282,198, filed on Dec. 29, 2009.

(51) Int. Cl.
| | | |
|---|---|---|
| *B65H 19/22* | (2006.01) | |
| *H01L 21/67* | (2006.01) | |
| *B65H 75/28* | (2006.01) | |
| *H01L 21/673* | (2006.01) | |

(52) U.S. Cl.
CPC ... *H01L 21/67126* (2013.01); *B65H 19/2276* (2013.01); *B65H 75/28* (2013.01); *B65H 75/285* (2013.01); *H01L 21/67363* (2013.01); *B65H 2405/421* (2013.01); *B65H 2601/25* (2013.01)

(58) Field of Classification Search
CPC .. B65H 75/28; B65H 75/285; B65H 2601/25; B65H 2405/421; B65H 19/28; B65H 19/29; B65H 2301/4148; B65H 19/2276; B65H 2301/414227; B65H 2301/41429; H01L 21/67126; H01L 51/0097; H01L 21/673; H01L 21/6735; H01L 21/67363; (Continued)

(56) References Cited

U.S. PATENT DOCUMENTS

| | | | | | |
|---|---|---|---|---|---|
| 2,821,883 | A | * | 2/1958 | Rusch | 359/461 |
| 3,528,623 | A | * | 9/1970 | Peeters | 242/532 |

(Continued)

FOREIGN PATENT DOCUMENTS

| | | |
|---|---|---|
| CN | 1713072 A | 12/2005 |
| CN | 101255782 A | 9/2008 |

(Continued)

OTHER PUBLICATIONS

International Search Report, from the European Patent Office in corresponding International Application No. PCT/JP2010/073899, dated Apr. 29, 2011.

(Continued)

*Primary Examiner* — Michael R Mansen
*Assistant Examiner* — Nathaniel L Adams
(74) *Attorney, Agent, or Firm* — Finnegan, Henderson, Farabow, Garrett & Dunner, L.L.P.

(57) ABSTRACT

A substrate case includes a shaft portion around which a sheet-shaped substrate having a circuit area in which a circuit manufacturing process is performed is wound; and a cover portion that accommodates the substrate in the state of being wound around the shaft portion, the shaft portion having a holding portion that holds an area different from the circuit area at a winding start portion of the substrate.

17 Claims, 11 Drawing Sheets

(58) Field of Classification Search
CPC ... B41J 15/02; B41J 15/04; A47K 2010/3206; G03B 21/326
USPC ... 242/530, 530.1, 530.2, 530.4, 532, 532.6, 242/532.7, 532.4, 584, 585, 579
See application file for complete search history.

(56) References Cited

U.S. PATENT DOCUMENTS

| | | | | |
|---|---|---|---|---|
| 3,622,099 | A * | 11/1971 | Bishop | B41J 33/003 242/586.4 |
| 4,165,138 | A * | 8/1979 | Hedge | A47K 10/3687 242/560 |
| 5,613,787 | A * | 3/1997 | Passer et al. | 242/332.8 |
| 5,947,618 | A * | 9/1999 | Keller | B41J 15/02 242/597.2 |
| 7,407,130 | B2 * | 8/2008 | Shimamura | 242/566 |
| 7,419,053 | B2 * | 9/2008 | Silverbrook et al. | 206/225 |
| 7,481,901 | B2 | 1/2009 | Toyoda et al. | |
| 2006/0118228 | A1 | 6/2006 | Toyoda et al. | |
| 2008/0210389 | A1 | 9/2008 | Debert | |
| 2008/0213621 | A1 | 9/2008 | Takashima et al. | |
| 2011/0085841 | A1 * | 4/2011 | Kiuchi | 400/613 |

FOREIGN PATENT DOCUMENTS

| | | |
|---|---|---|
| EP | 0660180 | 6/1995 |
| EP | 1965017 | 9/2008 |
| JP | UM-A-56-172837 | 12/1981 |
| JP | A-57-058134 | 4/1982 |
| JP | UM-B-05-011169 | 3/1993 |
| JP | A-06-100068 | 4/1994 |
| JP | A-06-156882 | 6/1994 |
| JP | A-07-181631 | 7/1995 |
| JP | A-07-209846 | 8/1995 |
| JP | A-2001-240313 | 9/2001 |
| JP | A-2003-104480 | 4/2003 |
| JP | A-2006-160390 | 6/2006 |
| JP | 2006-327784 | 12/2006 |
| WO | WO 2006/100868 A1 | 9/2006 |

OTHER PUBLICATIONS

Written Opinion of the International Searching Authority issued in corresponding International Application No. PCT/JP2010/073899 dated Apr. 29, 2011.
Official Action issued by Japanese Patent Office dated Jul. 1, 2014 in the counterpart Japanese application No. 2012-528573 with English abstract.
Office Action of the Intellectual Property Office of Taiwan in Taiwanese Patent Application No. 099146204, dated Apr. 7, 2015, and English translation thereof.
Office Action issued by the State Intellectual Property Office of People's Republic of China in counterpart Application No. 20 I 080060044.3 dated Mar. 12, 2014, and English translation thereof.

* cited by examiner

SUBSTRATE CASE AND SUBSTRATE ACCOMMODATION APPARATUS

CROSS-REFERENCE TO RELATED APPLICATION

This application is a non-provisional application claiming priority to and the benefit of U.S. provisional application No. 61/282,198, filed on Dec. 29, 2009. The entire contents of which are incorporated herein by reference.

BACKGROUND

The present invention relates to a substrate case and a substrate accommodation apparatus.

As a display element constituting a display device such as, for example, a liquid crystal display element, an organic electro luminescence (an organic EL) element, an electrophoresis element used in an electronic paper or the like are known. Recently, as such a display element, an active element (active device), in which a switching element called a Thin Film Transistor (TFT) is formed on a substrate surface and then each display device is formed thereon, has become mainstream.

Recently, a technique of forming a display element on a sheet-shaped substrate (e.g., a film member or the like) has been suggested. As this technique, for example, a method called a roll-to-roll type (hereinafter, simply designated as "roll type") is known (for example, see International Application Publication No. WO 2006/100868). The roll type delivers one sheet-shaped substrate (e.g., a band-like film member) wound around a supply roller on a substrate supply side and transports the substrate while winding up the delivered substrate using a withdrawal roller on the substrate withdrawal side.

From the substrate delivery to the winding up thereof, a gate substrate, a gate oxidation film, a semiconductor film, a source and drain electrode or the like constituting the TFT are formed using a plurality of processing apparatuses, and then the constituents of the display element are sequentially formed on the substrate. For example, in a case of forming an organic EL element on the substrate, a light emitting layer, an anode, a cathode, an electric circuit or the like are sequentially formed on the substrate. The substrate after the element is formed is transported to a processing apparatus of a subsequent process, for example, in the band shape as is or is forwarded as an individual display device by cutting the substrate.

SUMMARY

However, in a case where the substrate formed in this manner is transported or forwarded in an exposed state, since damage, destruction or deformation of the sheet-shaped substrate or the display element, the switching element or the like or attachment of foreign matter on the sheet-shaped substrate or the like are considered, careful handling is required. For this reason, for example, it is important to enhance the handling ability of the substrate during forwarding, transportation or the like.

A purpose of aspects of the present invention is to provide a substrate case and a substrate accommodation apparatus that can enhance the handling ability of the sheet-shaped substrate.

According to a first aspect of the present invention, there is provided a substrate case which includes a shaft portion around which a sheet-shaped substrate having a circuit area in which a circuit manufacturing process is performed is wound, and a cover portion that accommodates the substrate in the state of being wound around the shaft portion, the shaft portion having a holding portion that holds an area different from the circuit area in a winding start portion of the substrate.

According to a second aspect of the present invention, there is provided a substrate accommodation apparatus which includes a winding mechanism that winds a sheet-shaped substrate having a circuit area in which a circuit manufacturing process is performed around a shaft portion, and a transportation mechanism that accommodates the shaft portion in the state of winding the substrate in a cover portion.

According to aspects of the present invention, the handling ability of the sheet-shaped substrate can be enhanced.

DESCRIPTION OF EMBODIMENTS

Hereinafter, an embodiment of the present invention will be described with reference to the drawings.

Figure 1:
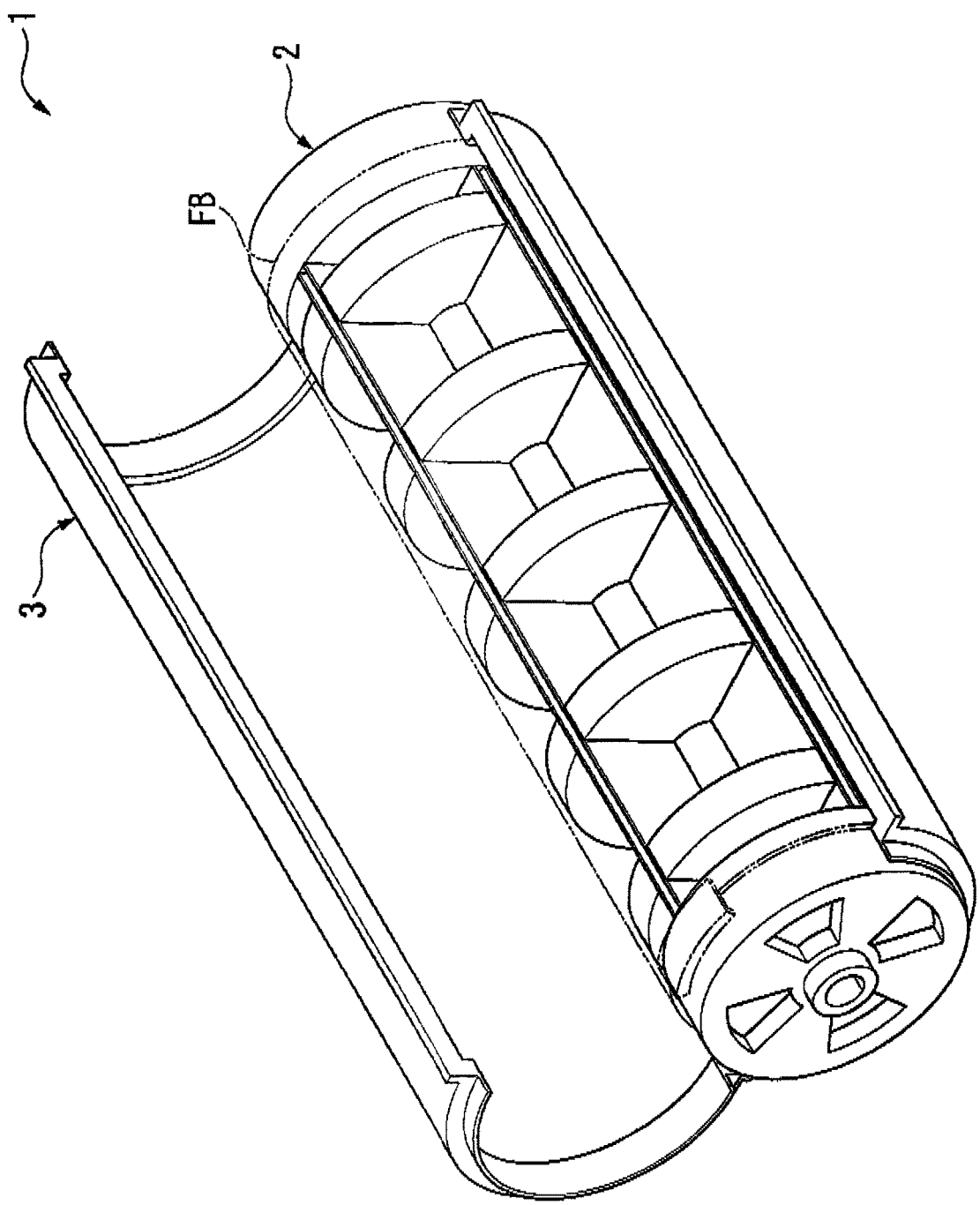
FIG. 1 is a perspective view that shows a configuration of a substrate case according to an embodiment of the present invention.

FIG. 1 is a perspective view that shows a configuration of a substrate case 1 according to an embodiment of the present invention.

As shown in FIG. 1, the substrate case 1 has a shaft portion 2 and a cover portion 3 and is configured so that the cover portion 3 is mounted on the shaft portion 2.

Figure 2:
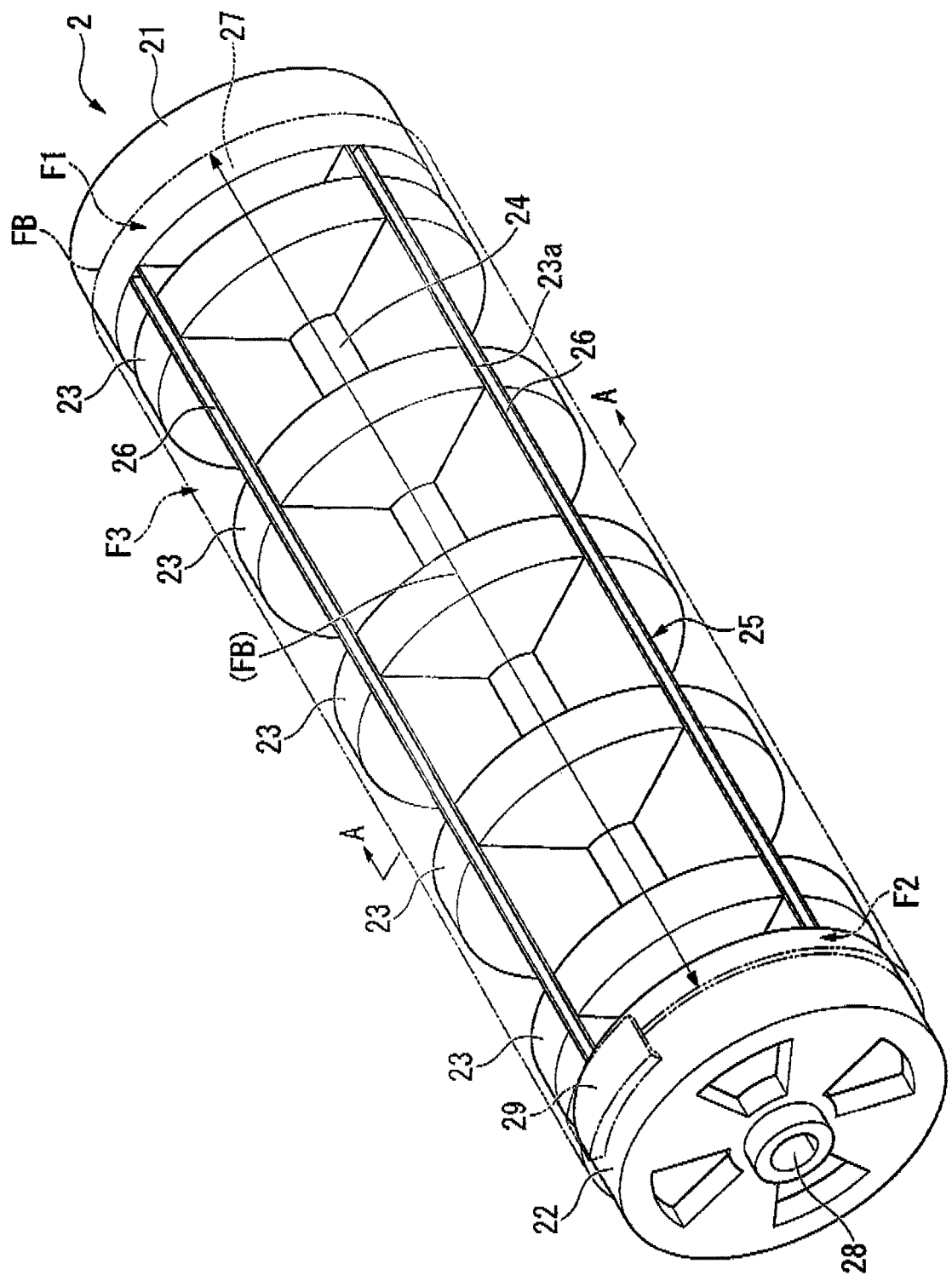
FIG. 2 is a perspective view that shows a configuration of a shaft portion according to the present embodiment.

FIG. 2 is a perspective view that shows a configuration of the shaft portion 2 from which the shaft portion 3 is separated.

As shown in FIG. 2, the shaft portion 2 is formed, for example, in approximately a cylindrical shape, and is, for example, a portion around which a substrate (a sheet substrate) FB such as a film member formed in the shape of a sheet is wound. The shaft portion 2 is formed, for example, using a renewable material such as a hard corrugated cardboard or a carton paper. Of course, the shaft portion 2 may have a configuration that is formed using other materials.

In the present embodiment, as the sheet substrate FB, for example, a foil of a resin film or stainless steel, or the like, is included. For example, the resin film can use materials such as polyethylene resin, polypropylene resin, polyester resin, ethylene vinyl copolymer resin, polyvinyl chloride resin, cellulose resin, polyamide resin, polyimide resin, polycarbonate resin, polystyrene resin, vinyl acetate resin or the like. On the sheet substrate FB, a circuit area RA (see FIG. 9), in which the circuit manufacturing process has been performed, is formed.

The shaft portion 2 has a first portion 21, a second portion 22, a rib portion 23, a connection portion 24, and a holding portion 25. A surface of the opposite side of the surface in which the circuit area RA is formed on the sheet substrate FB comes into contact with a surface of the first portion 21, a surface of the second portion 22, and a surface of the rib portion 23. The first portion 21, the second portion 22 and the rib portion 23 are configured so as to be connected to each other by a connection portion 24.

Both side portions of the sheet substrate FB in a transverse direction, that is, side edge portions F1 and F2 of the sheet substrate FB come into contact with the first portion 21 and the second portion 22, respectively. In the first portion 21 and the second portion 22, connection object portions 27 and 28 to be connected to an external rotation driving mechanism or a transporting mechanism are provided. For this reason, in a case of rotating or transporting the shaft portion 2, high driving efficiency or transportation efficiency can be obtained.

A major part between the side portions on the sheet substrate FB comes into contact with the rib portion 23. One or more rib portions 23 are provided between the first portion 21 and the second portion 22. In the present embodiment, for example, five rib portions 23 are provided. The rib portions 23 are disposed along the longitudinal direction of the shaft portion 2. The shaft portion 2 has a configuration that is lightened while maintaining a constant rigidity by forming a portion coming into contact with the major part of the sheet substrate FB as the rib portion 23.

The respective gaps of the first portion 21, the second portion 22 and the third portion 23 may all be, for example, equal gaps, or, similarly to the present embodiment, may have a configuration in which, for example, the gap between the first portion 21 and the rib portion 23 next to the first portion 21 may become smaller than the gap between the rib portions 23, and similarly, the gap between the second portion 22 and the rib portion 23 next to the second portion 22 may be smaller than the gap between the rib portions 23.

As shown in FIG. 2, the holding portion 25 holds an area different from the circuit area RA of a winding start portion FH (see FIG. 9 or the like, a leading portion for winding) of the sheet substrate FB. The holding portion 25 has a slot portion 26. The slot portion 26 has an opening portion into which one end portion (herein, the end portion FH) of the sheet substrate FB is inserted. The slot portion 26 is formed, for example, between the first portion 21 and the second portion 22 along the longitudinal direction of the shaft portion 2, and, for example, is formed from the surface of the shaft portion 2 toward the inside thereof in the diameter direction of the shaft portion 2.

In FIG. 2, the slot portion 6 of the holding portion 25 is formed extending transversely to the both side portions (the first portion 21 and the second portion 22) so as to correspond to the width of the front portion of the sheet substrate FB.

Figure 4:
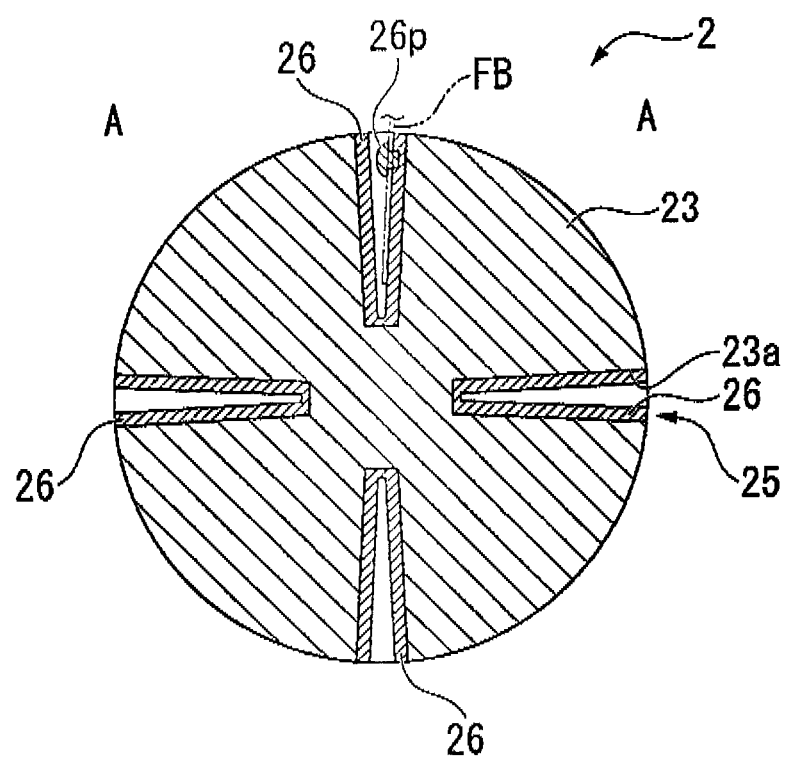
FIG. 4 is a diagram that shows a configuration taken along section A-A of the shaft portion according to the present embodiment.

FIG. 4 shows a configuration along section A-A in FIG. 2.

As shown in FIGS. 2 and 4, in the present embodiment, it is configured so that notch portions 23a are formed at part of each of a plurality of rib portions 23 and the slot portions 26 are inserted into the notch portions 23a. Thus, the winding start portion of the sheet substrate FB to be inserted into the slot portion 26 is formed in advance so that the size thereof in the transverse direction is shorter than the portion which is, for example, held in the first portion 21 or the second portion 22, and is then inserted into the slot portion 26. The slot portions 26 are, for example, provided in a plurality of locations around the circumference of the surface of the shaft portion 2. In the present embodiment, the slot portions 26 are provided in four locations, for example, at positions which deviate from each other by 90°.

In addition, a separate member (e.g., a leader member or the like of the sheet substrate FB) may be attached to the winding start portion of the sheet substrate FB and the size of the separate member of the sheet substrate FB in the transverse direction may be smaller than that of the sheet substrate FB in the same direction. In this case, since the machining is completed to the extent of attaching a separate member to the sheet substrate FB, for example, complex machining such as the cutting of the sheet substrate FB does not need to be performed.

Furthermore, notch portions for disposing the slot portions 26 may also be provided in part of the first portion 21 or the second portion 22, and the slot portions 26 may be provided up to part of the first portion 21 and the second portion 22. In this case, the one end portion can be inserted into the slot portion 26 without machining (or fabricating) the winding start portion of the sheet substrate FB.

As shown in FIG. 4, the slot portions 26 are fanned so that the gaps thereof become gradually narrow from the surface of the shaft portion to the center thereof. For this reason, upon inserting the sheet substrate FB into the slot portion 26, the sheet substrate FB is pinched into the narrowed portion of the gap among the slot portion 26 and is held. In addition, the sheet substrate FB is inserted into the slot portion 26 and is held, and additionally, the end portion FH of the sheet substrate FB may be fixed to the first portion 21 or the second portion 22 by a fixing pin 26p.

Specifically, a plurality of fixing pins 26p is provided in the inner portion of the slot portion 26 in an attachable and detachable manner with respect to the width direction of the sheet substrate FB, whereby the winding start portion of the sheet substrate FB is fixed to the slot portion 26 by the fixing pin 26p. By fixing the winding start portion of the sheet substrate FB using the fixing pin 26p, it is possible to avoid an inclination of the one end portion of the sheet substrate FB with respect to the longitudinal direction of the shaft portion 2.

Figure 3:
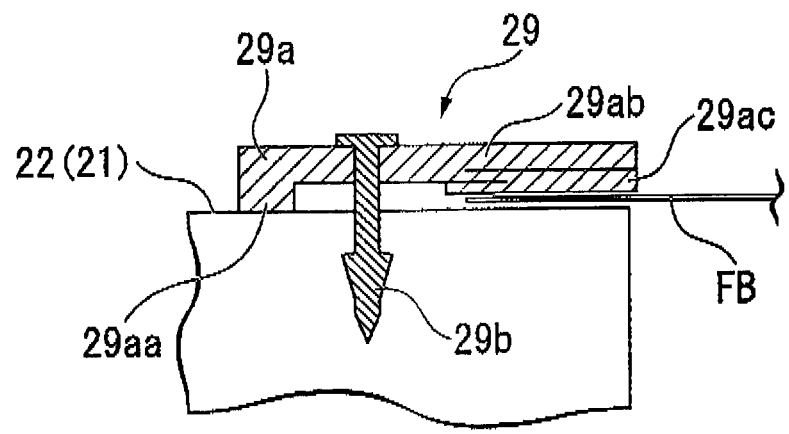
FIG. 3 is a cross-sectional view that shows a configuration of part of the shaft portion according to the present embodiment.

In at least one of the first portion 21 and the second portion 22, there is provided a clamp mechanism 29 which pinches a winding rear portion FH (a terminal portion for winding) of the sheet substrate FB together with at least one surface of the first portion 21 and the second portion 22. FIG. 3 is a cross-sectional view that shows a configuration of the clamp mechanism 29. As shown in FIG. 3, the clamp mechanism 29 has a pushing plate 29a and a metallic pin 29b, whereby the pushing plate 29a is adapted to be fixed to the first portion 21 or the second portion 22 by the metallic pin 29b.

The pushing plate 29a includes a contact portion 29aa which comes into contact with the first portion 21 or the second portion 22, a metallic pin attachment portion 29ab formed with a through hole into which the metallic pin 29b is inserted, and a non-contact portion 29ac which forms a gap between it and the first portion 21 or the second portion 22 when the clamp mechanism 29 is mounted on at least one of the first portion 21 and the second portion 22. That is, the pushing plate 29a includes the contact portion 29aa on one end portion of either end of the pushing plate 29a, includes the non-contact portion 29ac in the other end portion thereof, and includes the metallic pin attachment portion 29ab between the contact portion 29aa and the non-contact portion 29ac. When seen in the cross section thereof, the pushing plate 29a is formed, for example, in an L shape. When the pushing plate 29a is mounted on the first portion 21 or the second portion 22, the gap formed between the non-contact portion 29ac and the surface of the first portion 21 or the surface of the second portion 22 has a size equal to the thickness of the sheet substrate FB. In addition, similarly to the winding start portion, a separate member may be attached to the winding rear portion of the sheet substrate FB.

Figure 5:
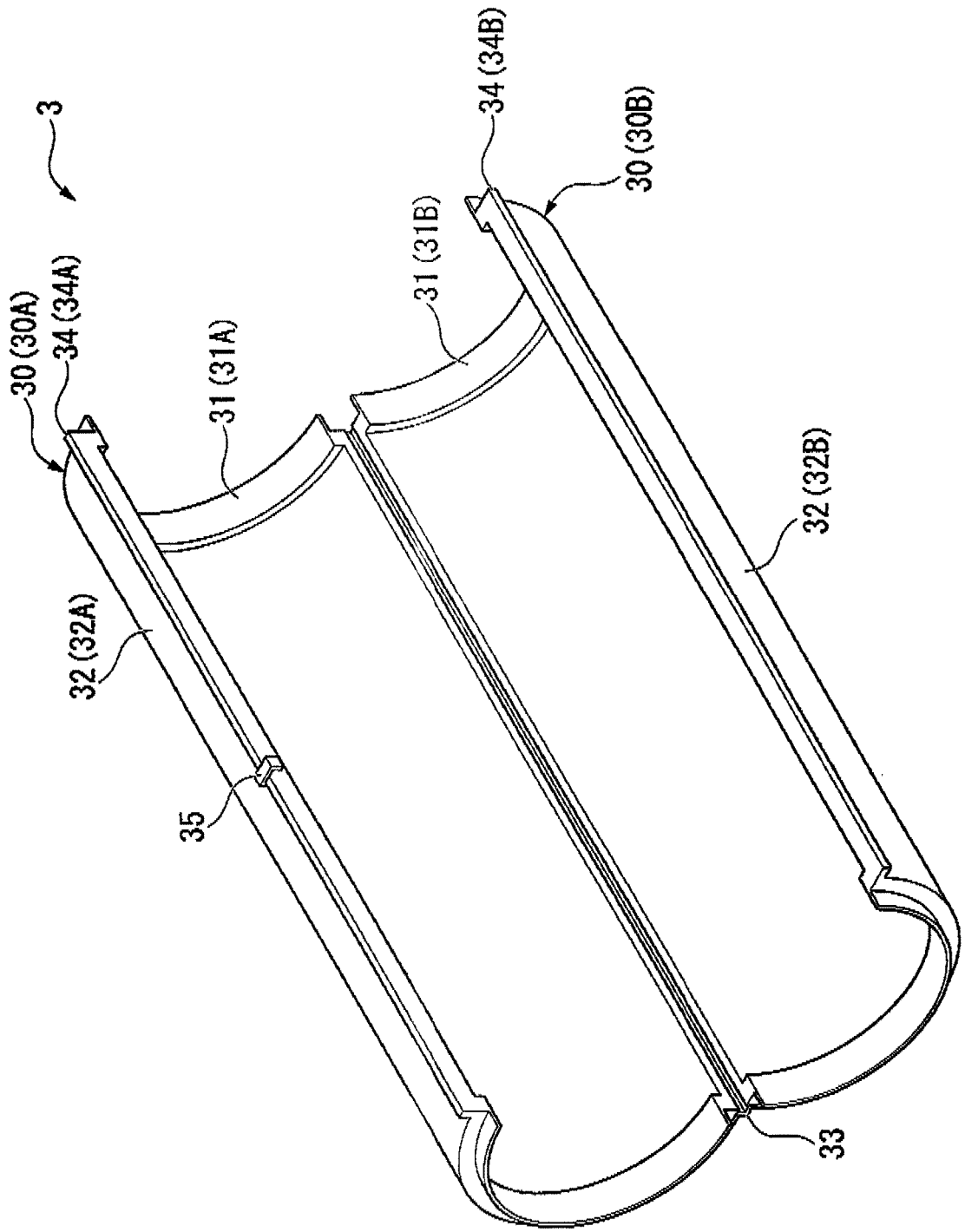
FIG. 5 is a perspective view that shows a configuration of a cover portion according to the present embodiment.

FIG. 5 is a perspective view that shows the configuration of the cover portion 3 in a state of being separated from the shaft portion 2.

As shown in FIGS. 1 and 5, the cover portion 3 accommodates the sheet substrate FB in a state of being wound around the shaft portion 2, for example, for each shaft portion 2. Similarly to the shaft portion 2, the cover portion 3 is formed, for example, using a renewable material such as a hard corrugated cardboard or a carton paper. Of course, the cover portion 3 may be formed using other materials.

With reference to FIG. 5, the cover portion 3 has cover members 30 (30A and 3013) and a hinge portion 33, and the two cover members 30 are connected to each other via the hinge portion 33 in an operable and closable manner. Each cover member 30 has shaft holding portions 31 (31A and 31B), protection portions 32 (32A and 32B) and lid portions 34 (34A and 34B) that are provided in both end portions. In addition, a handle (not shown) or the like may be provided on the outer surface of the cover member 30.

Since the shaft holding portions 31A and 31B have the same configuration, the shaft holding portion 31A will be described and the description of the shaft holding portion 31B will be omitted. The shaft holding portion 31A is a portion that holds the first portion 21 of the shaft portion 2 upon being mounted on the shaft portion 2. The protection portion 32 is a portion which is connected to the shaft holding portion 31A and is formed so as to be bent along the circumferential direction of the shaft portion 2 to hide the sheet substrate FB wound around the shaft portion 2. The shaft holding portion 31A is configured to hold the shaft portion 2 so that the first portion 21 is exposed. The hinge portion 33 has for example, an elastic portion (not shown) that causes the elastic force to act in a direction that opens the two cover members 30.

The lid portion 34 is provided in the end portion of the protection portion 32, so that the lid portion 34 is overlapped with the lid portion 34B in the state in which the cover member 30A and the cover member 30B are closed. For example, by fixing the lid portion 34A and the lid portion 34B so as not to be opened using the fixing tool 35 or the like in the state in which the lid portion 34A overlaps with the lid portion 34B, the closed state of the cover member 30A and the cover member 30B can be maintained.

Next, a configuration of a substrate accommodation apparatus 100 which accommodates the sheet substrate FB in the substrate case 1 configured as above will be described.

Figure 6:
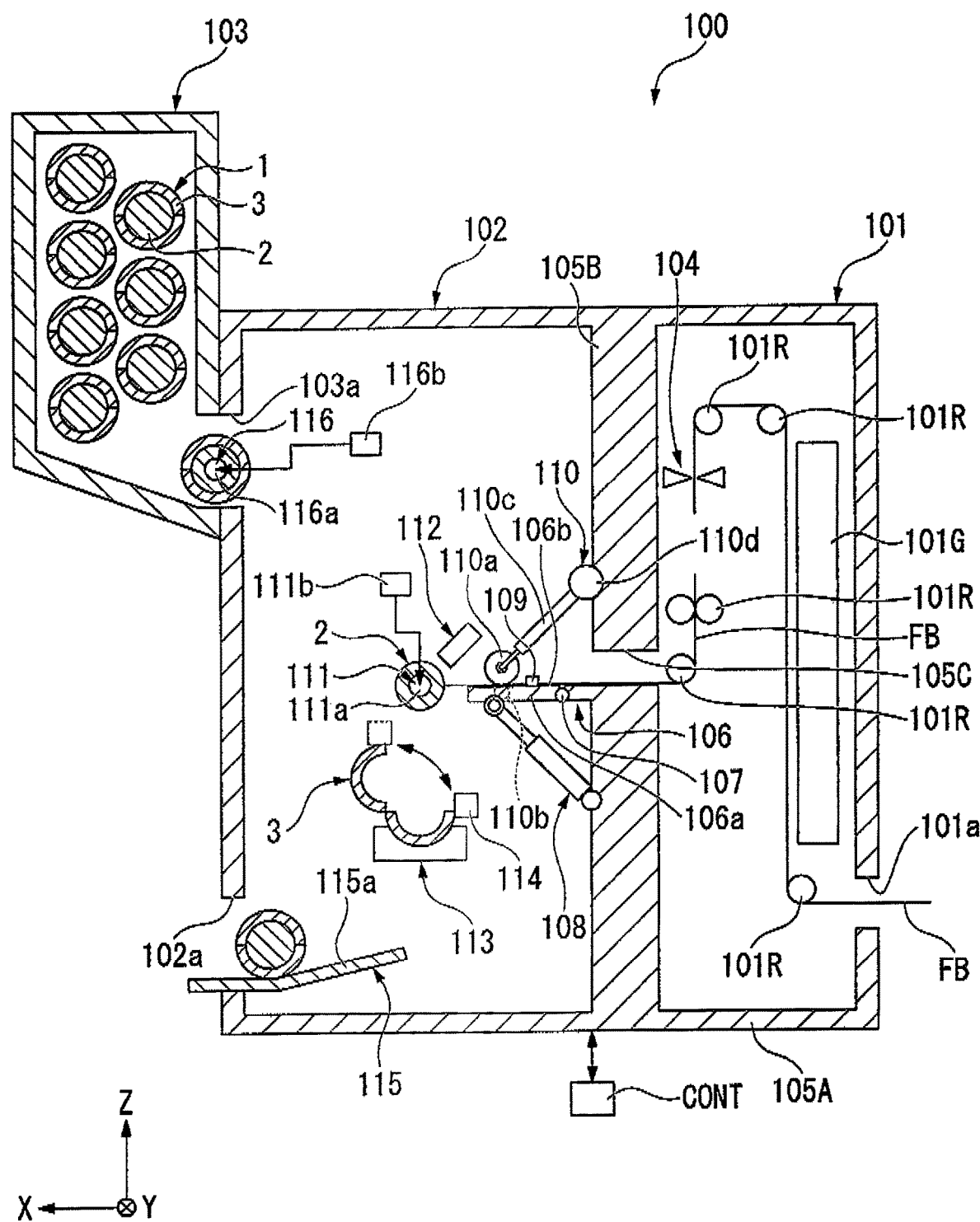
FIG. 6 is a schematic diagram that shows a configuration of a substrate accommodation apparatus according to the present embodiment.

FIG. 6 is a schematic configuration diagram of the substrate accommodation apparatus 100.

As shown in FIG. 6, the substrate accommodation apparatus 100 has a substrate carrying portion 101, an accommodating processing portion 102, a case supply portion 103, and a control apparatus CONT.

The substrate carrying portion 101 has a substrate carrying opening 101a that carries in the sheet substrate FB into the substrate accommodation apparatus 100. In the substrate carrying portion 101, a transport roller 101R and a guide member 101G are provided along the transport path of the sheet substrate FB.

For example, a plurality of transport rollers 101R is provided along the transport path to transport the sheet substrate FB to the accommodating processing portion 102. The guide member 101G guides the sheet substrate FB that is transported by the transport roller 101R. A substrate cutting portion 104 is provided on the transport path of the sheet substrate FB in the substrate carrying portion 101. The substrate cutting portion 104 cuts the sheet substrate FB which is, for example, formed in a band shape into individual sheet substrates FB.

The accommodating processing portion 102 is disposed adjacent to the substrate carrying portion 101 with the wall members 105A and 105B pinched therebetween. The accommodating processing portion 102 is connected to the substrate carrying portion 101 via an opening portion 1050 that is formed between the wall member 105A and the wall member 105B. In the accommodating processing portion 102, the guide member 106 which extends along the transport direction of the sheet substrate FB from the wall member 105A is provided.

The guide member 106 guides the sheet substrate FB that is transported from the opening portion 105C. The guide member 106 has a joint portion 107, so that part (a front portion 106a) of the downstream side of the sheet substrate FB in the transport direction from the joint portion 107 is bent. The front portion 106a is connected to, for example, one end of the support mechanism 108. The other end of the support mechanism 108 is connected to the wall member 105A. Thus, the front portion 106a is supported by the wall member 105A via the support mechanism 108.

The support mechanism 108 has, for example, a piston mechanism, an air cylinder mechanism or the like and is formed flexibly in the support direction. The stretch amount of the support mechanism 108 can be adjusted by an adjustment mechanism (not shown) or the like. The support mechanism 108 stretches by a predetermined stretch amount, so that the front portion 106a is bent around the joint portion 107 at a predetermined angle.

Figure 7:
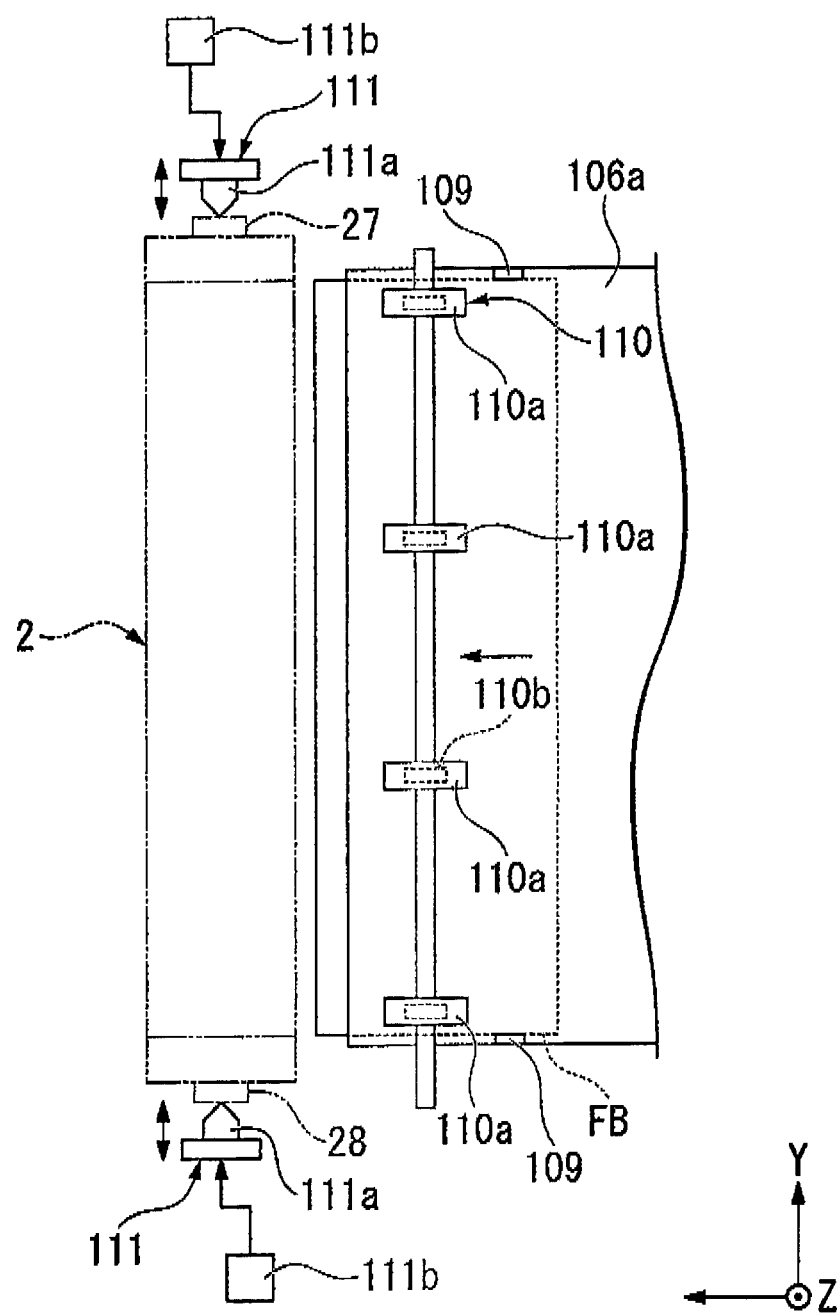
FIG. 7 is a top plane view that shows a configuration of part of a substrate accommodation apparatus according to the present embodiment.

The accommodating processing portion 102 has a transportation mechanism 110 that transports the sheet substrate FB. The transportation mechanism 110 has transport rollers 110a and 110b. FIG. 7 is a top plane view that shows the configuration of the front portion 106a. In addition, in FIG. 7, part of the constituents shown in FIG. 6 is omitted. As shown in FIG. 7, the transport roller 110a is provided at the upper part of a guidance surface 106b. The transport roller 110b is, for example, mounted on the front portion 106a. A plurality of transport rollers 110a and 11b is disposed in a direction perpendicular to the transport direction of the sheet substrate FB.

As shown in FIG. 6, each of the transport rollers 110a is, for example, connected to the wall member 105B via the support arm 110a and the joint portion 110d. The support aim 110c is provided rotatably around the joint portion 110d and the rotation amount thereof can be adjusted by an adjustment mechanism (not shown). By adjusting the rotation amount of the support arm 110c, it is possible to adjust the position of the transport roller 110b relative to the transport roller 110b depending on the bending angle of the front portion 106a.

The transport roller 110b is mounted on a concave portion formed in the front portion 106a. The concave portion is formed at a position where it overlaps with the transport roller 110a in the state in which the transport roller 110a is adjacent thereto. The transport roller 110b is disposed within the concave portion so as to have substantially the same surface state as the guidance surface 106b. In a case where the sheet substrate FB is disposed on the transport roller 110b, by making the transport roller 110a adjacent to the front portion 106a, it is possible for the transport roller 110a and the transport roller 110b to pinch the sheet substrate FB therebetween. In at least one of the transport roller 110a and the transport roller 110b, a rotation driving mechanism (not shown) is provided. The transport roller 110a and the transport roller 110b are rotated by the rotation driving mechanism, whereby the sheet substrate FB is transported by the rotation force.

A position adjustment mechanism 109 is provided on the guidance surface 106b of the sheet substrate FB in the front portion 106a. As shown in FIG. 7, a pair of position adjustment mechanisms 109 is installed so as to pinch the transport path of the sheet substrate FB on the guidance surface 106b. The pair of position adjustment mechanisms 109 comes into contact with the sides of the sheet substrate FB, respectively. The transport direction of the sheet substrate FB is corrected while transporting the sheet substrate FB by the position adjustment mechanism 109, thereby performing alignment of the transport location of the sheet substrate FB.

At the downstream side of the sheet substrate FB in the transport direction relative to the front portion 106a, a rotation driving mechanism 111 which holds and rotates the shaft portion 2 is disposed. For example, as shown in FIG. 7, the rotation driving mechanism 111 has a pair of rotators 111a which is provided at a position pinching both end portions of the shaft portion 2 in the rotation shaft direction, and a driving portion 111b which drives the pair of rotators 111a. The rotator 111a is connected to each of the connection object portions 27 and 28 with respect to the shaft portion 2. The driving portion 111b has, for example, a motor (not shown) or the like.

The rotator 111a is attachably and detachably installed with respect to the shaft portion 2 by the driving of the driving portion 111b and is provided rotatably using the longitudinal direction of the shaft portion 2 as the rotational axis. The rotator 111a rotates in the state of being connected to the connection object portions 27 and 28, whereby the shaft portion 2 rotates.

As shown in FIG. 6, the rotator 111a is disposed so as to hold the shaft portion 2 in a position where it is adjacent to the front portion 106a. At the upper part of the front portion 106a in FIG. 6, a clamp mounting mechanism 112 for mounting the clamp mechanism 29 with respect to the shaft portion 2 is installed. The clamp mounting mechanism 112 has, for example, a driving mechanism (not shown) and is installed so as to be accessible to the shaft portion 2 and retractable from the shaft portion 2.

At the lower part of the rotation driving mechanism 111 in the drawings, a cover holding portion 113 and a cover opening and closing mechanism 114 are provided. The cover holding portion 113 is a portion for holding the cover portion 3. The cover opening and closing mechanism 114 is a portion that opens and closes the cover holding portion 113. The cover opening and closing mechanism 114 has an attachment and detachment mechanism (not shown) that attaches and detaches the fixing tool 35 with respect to the cover portion 3. Furthermore, the cover opening and closing mechanism 114 has, for example, a holding portion (not shown) which holds the lid portion 34 of the cover portion 3, and is movably provided in the state of holding the lid portion 34.

A discharging mechanism 115 is installed at the downstream side of the rotation driving mechanism 111 and the cover holding portion 113. The discharging mechanism 115 is a portion that is connected to a case discharging portion 102a of the accommodating processing portion 102 and guides the substrate case 1 to the case discharging opening 102a. The discharging mechanism 115 has a guide member 115a which is tilted so that, for example, the case discharging opening 102a side becomes the lower part. The substrate case 1 rolls on the guide member 115a and is guided to the case discharging opening 102a.

The case supply portion 103 is disposed, for example, at the upper part of the discharging mechanism 115 in the drawings. A plurality of substrate cases 1 is accommodated in the case supply portion 103. In the respective substrate cases 1 that are accommodated in the case supply portion 103, the shaft portions 2 and the cover portion 3 are integrated with each other. The case supply portion 103 is connected to the accommodating processing portion 102 via the case supply opening 103a.

A case transportation mechanism 116 is provided between the case supply portion 103 and the accommodating processing portion 102. The case transportation mechanism 116 is provided so that it can transport the substrate case 1 between the case supply portion 103 and the accommodating processing portion 102. The case transportation mechanism 116 has a mover 116a that is connected to the connection object portions 27 and 28 of the shaft portion 2, and a driving portion 116b that drives the mover 116a. A pair of movers 116a is provided, for example, at a position where they pinch the longitudinal end portion of the shaft portion 2 therebetween. The driving portion 116b is adapted to drive the pair of movers 116a in synchronous with each other. The movers 116a are movably provided, for example, with respect to each of the case supply portion 103, the rotation rotating mechanism 111, and the cover holding portion 113. Thus, the case transportation mechanism 116 is adapted to transport the substrate case 1 or a part thereof between the case supply portion 103, the rotation driving mechanism 111 and the cover holding portion 113.

The substrate accommodation apparatus 100 configured as above is used by being connected to, for example, a substrate processing apparatus, which forms a circuit area on the sheet substrate FB, or the like.

Figure 8:
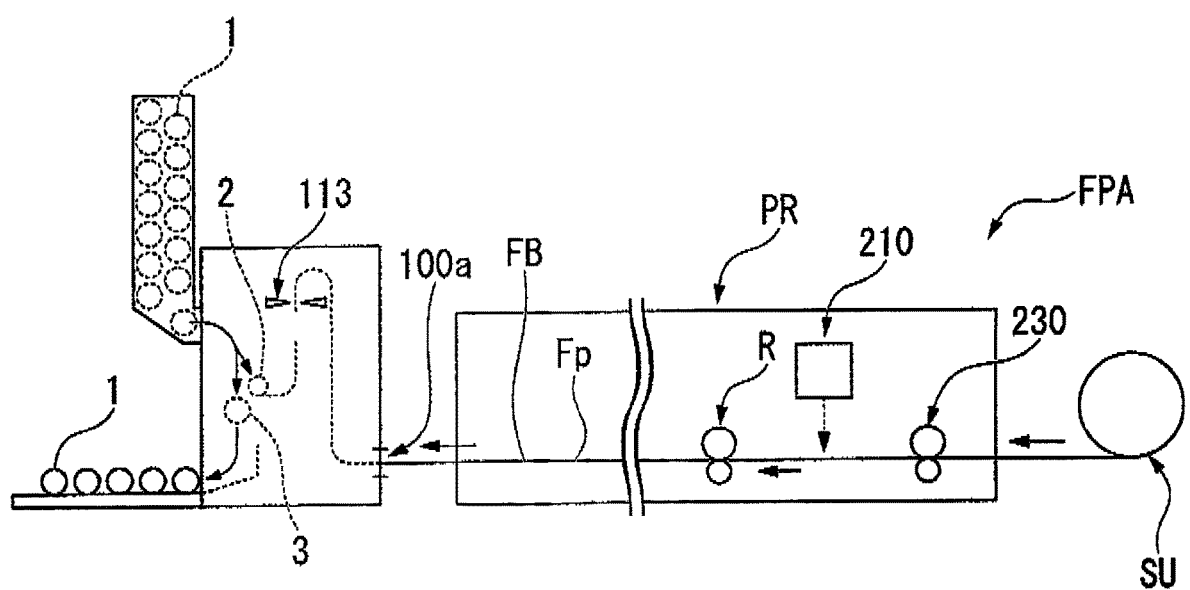
FIG. 8 is a schematic diagram that shows configurations of a substrate processing apparatus and a substrate accommodation apparatus according to the present embodiment.

FIG. 8 is a diagram that shows a configuration of a case where the substrate accommodation apparatus 100 is connected to the substrate processing apparatus FPA and used.

As shown in FIG. 8, the substrate processing apparatus FPA has a substrate supply portion SU which supplies a sheet substrate (e.g., a film member) FB, a substrate processing portion PR which performs the processing with respect to the sheet substrate FB, and the above-mentioned substrate accommodation apparatus 100. The substrate processing apparatus FPA is used, for example, by being installed at a factory or the like.

In the substrate processing apparatus FPA, the circuit area RA or the like is formed on the sheet substrate FB by a so-called roll-to-roll type (hereinafter, designated by a roll type). Firstly, the band-shaped sheet substrate FB is wound around the roller provided in the substrate supply portion SU, so that the sheet substrate FB is delivered from the substrate supply portion SU.

The substrate processing portion PR includes a transportation apparatus 230, and a processing apparatus 210 that performs the processing with respect to the processing surface Fp of the sheet substrate FB during transportation.

The transportation apparatus 230 transports the sheet substrate FB to be supplied from the substrate supply portion SU within the substrate processing portion PR and has a roller apparatus R to be transported to a substrate withdrawal portion CL side. For example, a plurality of roller apparatuses R is provided along the transport path of the sheet substrate FB. A driving mechanism (not shown) is mounted on the roller apparatus R of at least part of the plurality of roller apparatuses R. By the rotation of the roller apparatuses R, the sheet substrate FB is transported in a predetermined direction. For example, the roller apparatus R of a part of the plurality of roller apparatuses R may be movably installed in a direction perpendicular to the transport direction.

The processing apparatus 210 has various devices for forming, for example, the circuit area RA with respect to the processing surface Fp of the sheet substrate FB that is transported by the transportation apparatus 230. As such a device, for example, an electrode forming device for forming an electrode on the processing surface Fp, an element forming device which forms a switching element on the processing surface Fp, or the like can be adopted. Furthermore, in a case where a display element such as an organic EL element is formed, a partition forming device for forming a partition, a light emitting layer forming device which forms a light emitting layer or the like are used. More specifically, a film forming device such as a liquid droplet application device (e.g., an ink jet type application device, a spin coat type application device or the like), a vapor deposition device and a sputtering device, a light exposure device, a developing device, a surface reforming device, a cleaning device or the like can be adopted. The respective devices are, for example, suitably provided on the transport path of the sheet substrate FB. In addition, the substrate processing portion PR may have an alignment mechanism or the like that performs the alignment operation or the like with respect to the sheet substrate FB.

Figure 9:
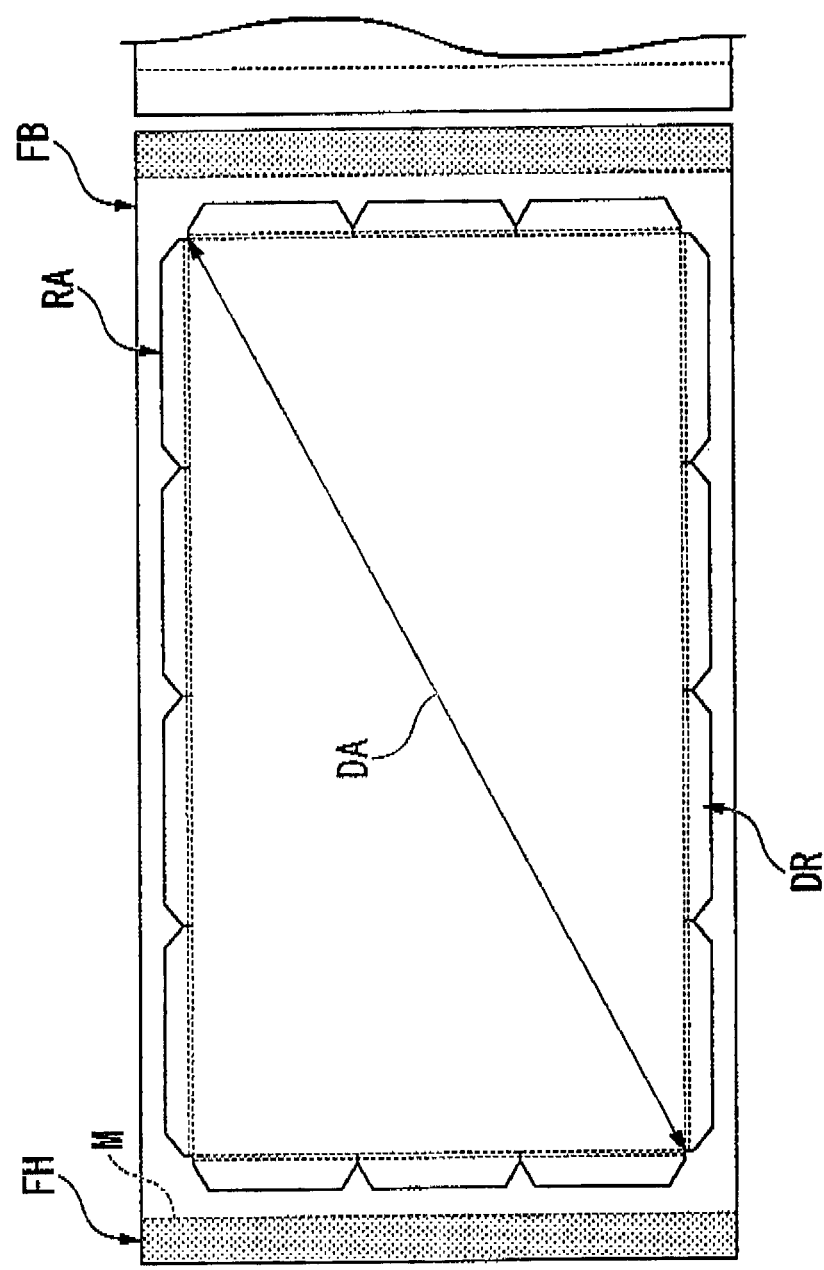
FIG. 9 is a diagram that shows a configuration of part of a sheet substrate according to the present embodiment.

In addition, the transportation apparatus 230 transports the sheet substrate FB within the substrate processing portion PR, and, for example, a plurality of circuit areas RA shown in FIG. 9 is formed along the longitudinal direction on the sheet substrate FB by the processing apparatus 210. In the circuit area RA formed on the sheet substrate FB, for example, a display element and a switching element to be formed on the display area DA or a driver circuit to be formed in the driver area DR or the like are included. The sheet substrates FB formed with the circuit area RA are sequentially discharged from the substrate processing portion PR.

The size of the sheet substrate FB in the width direction (transverse direction) is formed, for example, by about 1 m to 2 m, and the size thereof in the X direction (longitudinal direction) is formed, for example, by about 10 m or more. Of course, the sizes are merely an example, and are not limited thereto. For example, the size of the sheet substrate FB in the Y direction may be 50 cm or less or 2 m or more. Moreover, the size of the sheet substrate FB in the X direction may be 10 m or less.

The substrate accommodation apparatus 100 is used, for example, by being connected to the downstream side of the transport direction of the sheet substrate FB of the substrate processing apparatus FPA. The sheet substrate FB discharged from the substrate processing apparatus FPA is carried into the substrate carrying opening 101a of the substrate accommodation apparatus 100, for example, in the band shape as is.

Next, the operation of the substrate accommodation apparatus 100 configured as above will be described.

The control apparatus CONT controls the case transportation mechanism 116, moves the case transportation mechanism 116 to the case supply portion 103, and carries the substrate case 1 into the accommodating processing portion 102. In the present embodiment, since the shaft holding portion 31 of the cover portion 3 is held so as to expose the first portion 21 and the second portion 22 of the shaft portion 2, the connection object portion 27 formed in the first portion 21 and the connection object portion 28 formed in the second portion 22 are in the exposed state. Thus, even in the state in which the cover portion 3 is integrated with the shaft portion 2, the mover 116a of the case transportation mechanism 116 can be connected to each of the connection object portions 27 and 28.

Then, the control apparatus CONT controls the case transportation mechanism 116, moves the case transportation mechanism 116 to the cover holding portion 113, holds the cover portion 3 of the substrate case 1, and puts the cover opening and closing mechanism 114 in the open state, thereby separating the shaft portion 2 from the cover portion 3. Next, the control apparatus CONT moves the case transportation mechanism 116 to the rotation driving mechanism 111, thereby passing the shaft portion 2, which was separated from the cover portion 3, to the rotation driving mechanism 111. The control apparatus CONT holds the shaft portion 2 at a position that is adjacent to the front portion 106a, and adjusts the rotation position of the rotation driving mechanism 111, thereby setting the state in which the slot portion 26 of the shaft portion 2 faces the upstream side of the transport direction of the sheet substrate FB.

In this state, the control apparatus CONT drives the transport roller 1018, thereby transporting the sheet substrate FB which was carried into the substrate accommodation apparatus 100 via the substrate carrying opening 101a. When the sheet substrate FB reaches the substrate cutting portion 104, for example, as shown in FIG. 9, the control apparatus CONT cuts the sheet substrates FB for each circuit area RA using the substrate cutting portion 104. At this time, for example, a perforation M is formed in the winding start portion FH of the sheet substrate FB. Furthermore, at this time, the shape of the end portion FH may be adjusted to a shape that can be inserted into the slot portion 26.

Figure 10:
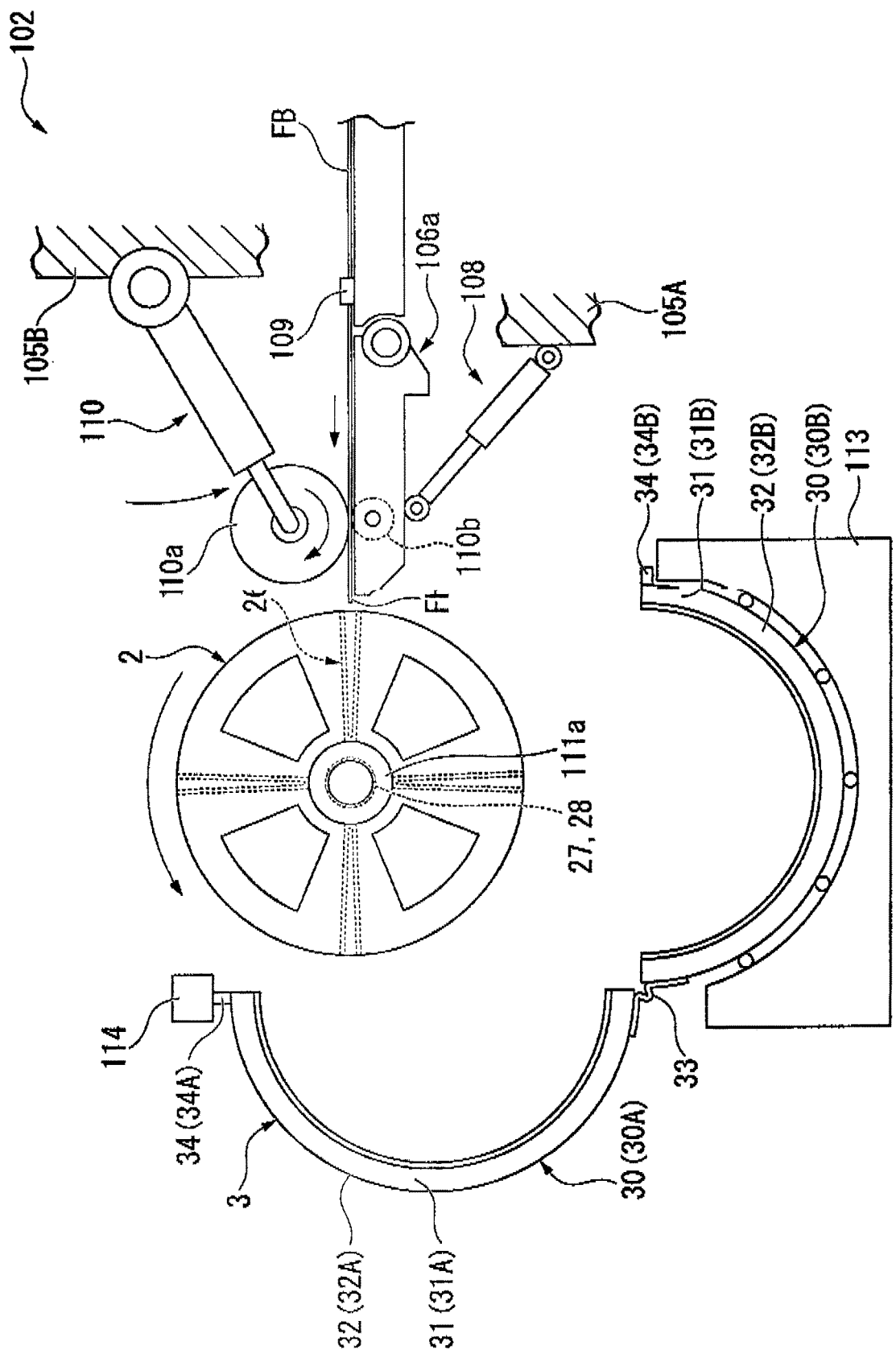
FIG. 10 is diagram that shows an operation of a substrate accommodation apparatus according to the present embodiment.

As shown in FIG. 10, after the sheet substrates FB have been cut, the control apparatus CONT transports the respective cut sheet substrates FB to the accommodating processing portion 102. The sheet substrates FB are guided into the accommodating processing portion 102 along the guide member 106. The control apparatus CONT drives the support mechanism 108 and horizontally supports the front portion 106a, so that the sheet substrates FB pass over the front portion 106a. At this time the slot portion 26 of the shaft portion 2 is disposed in the vicinity of the front portion 106a. The position of the sheet substrate FB in a direction perpendicular to the transport direction is adjusted by the position adjustment mechanism 109 in the process of passing over the front portion 106a. In addition, in order to prevent the substrate case 1 or the shaft portion 2 from interfering with the front portion 106a before the shaft portion 2 of the substrate case 1 is transported to the rotation driving mechanism 111, the support mechanism 108 may be bent downwardly from the horizontal direction of the front portion 106a. Furthermore, the support mechanism 108 may be adjusted to match the height of the shaft portion 2 supported by the rotation driving mechanism 111, thereby adjusting the height position of the sheet substrate FB that is delivered from the front portion 106a.

Furthermore, the control apparatus CONT disposes the transport roller 110a on the transport roller 110b of the front portion 106a, thereby putting the sheet substrate FB in the transportable state. The sheet substrate PB which reaches between the transport roller 110a and the transport roller 110b is transported to the downstream side of the transport direction by the transport roller 110a and the transport roller 110b, whereby the winding start portion FH of the sheet substrate FB is inserted into the slot portion 26. The insertion amount of the end portion FH relative to the slot portion 26 is regulated so that the perforation M formed in the end portion FH moves near the opening portion of the slot portion 26. For example, the insertion amount may be adjusted by the transportation amount of the sheet substrate FB relative to the slot portion 26 through the control apparatus CONT. Otherwise, the machining position of the perforation M may be adjusted in advance in view of the state in which the end portion FH is inserted into the slot portion 26. Since, in the sheet substrate FB, only the area different from the circuit area RA is inserted into the slot portion 26 and held, damage or the like to the circuit area RA or the like is avoided.

Figure 11:
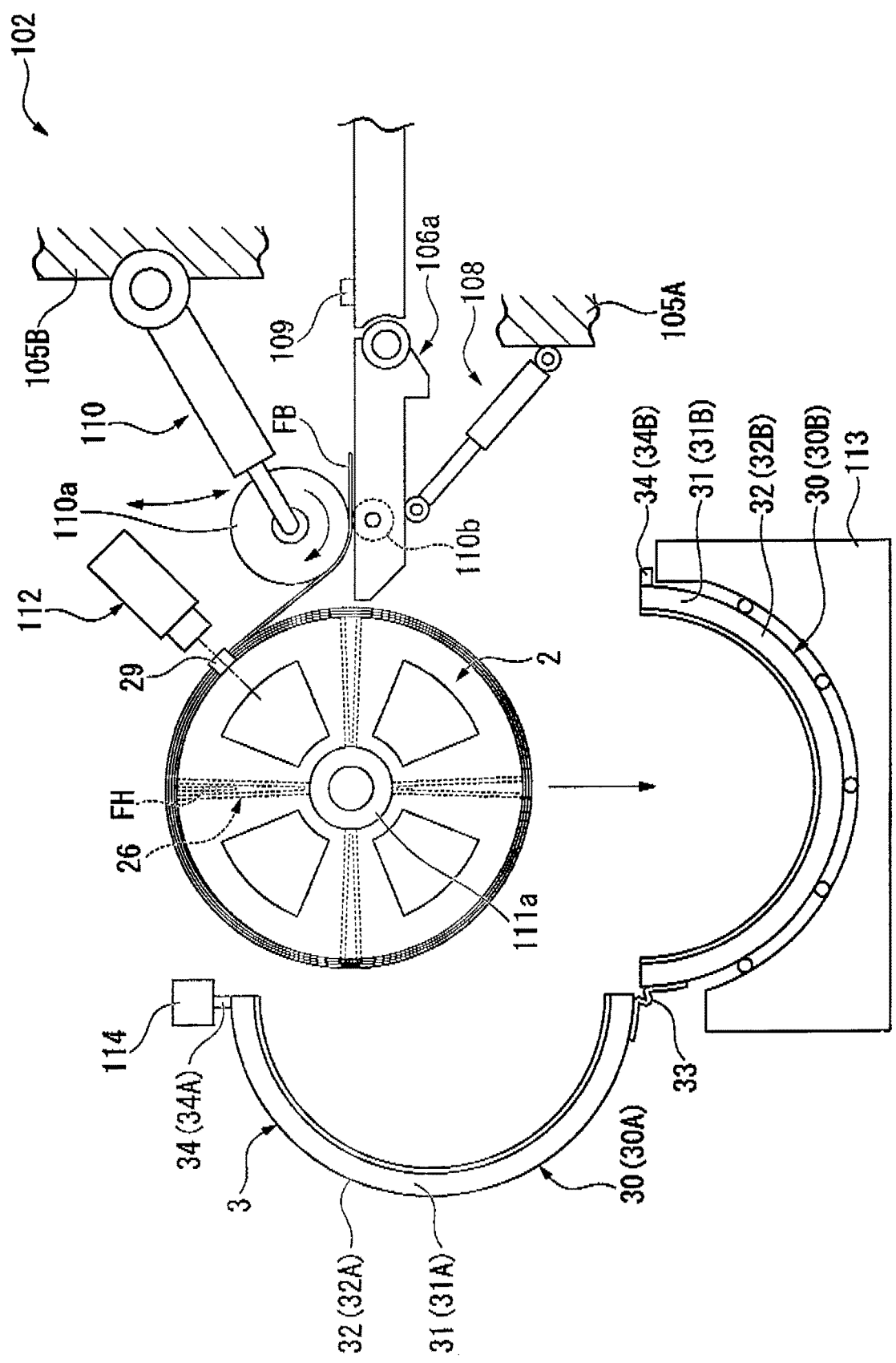
FIG. 11 is an operational diagram thereof.

After the end portion FH of the sheet substrate FB is inserted into the slot portion 26, as shown in FIG. 11, the control apparatus CONT rotates the shaft portion 2 by rotating the rotator 111a. In addition, before rotating the shaft portion 2, as described above, the end portion FH within the slot portion 26 may be fixed by the fixing pin 26p. In addition, the sheet substrate FB is wound around the shaft portion 2 by the rotation of the shaft portion 2. At this time, since the perforation M of the sheet substrate FB is bent along the winding direction, the sheet substrate FB is smoothly wound without any protrusions.

After the winding of the sheet substrate FB is finished, the control apparatus CONT mounts the clamp mechanism 29 to the shaft portion 2 by the clamp mounting mechanism 112, and fixes the winding rear portion FH of the sheet substrate FB wound around the shaft portion 2 to at least one of the first portion 21 and the second portion 22. After the clamp mechanism 29 is mounted, the control apparatus CONT passes the shaft portion 2 from the rotation driving mechanism 111 to the case transportation mechanism 116, thereby accommodating the shaft portion 2 within the cover portion 3 by the case transportation mechanism 116.

The control apparatus CONT puts the cover portion 3 in the closed state using the cover opening and closing mechanism 114 after the shaft portion 2 is accommodated in the cover portion 3, and mounts the fixing tool 35 to the lid portion 34 of the cover portion 3, thereby maintaining the closed state. As a result, the shaft portion 2 and the cover portion 3 are integrated with each other and become the state of the substrate case 1, and the sheet substrate FB wound around the shaft portion 2 is accommodated in the cover portion 3. The control apparatus CONT transports the substrate case 1 to the discharging mechanism 115 by the case transportation mechanism 116. The substrate case 1 is transported to the case discharging opening 102a via the discharging mechanism 115 and is discharged from the case discharging opening 102a to the outside of the substrate accommodation apparatus 100.

By repeatedly performing the operation, for example, for each circuit area RA of the sheet substrate FB, in the state in which the formed sheet substrate FB of the circuit area RA is accommodated in the substrate case 1, the substrate cases 1 are sequentially discharged from the case discharging opening 102a. The substrate cases 1 formed in this manner are forwarded, for example, in the discharged state or are discharged to the line of the subsequent process or the like.

As described above, the substrate case 1 of the present embodiment includes the shaft portion 2 that can wind the sheet substrate FB having the circuit area RA in which the circuit manufacturing process is performed, and the cover portion 3 that accommodates the sheet substrate FB in the state of being wound around the shaft portion 2, the shaft portion 2 having the holding portion 25 that holds an area different from the circuit area RA among the winding start portion FH of the sheet substrate FB. Thus, the sheet substrate FB can be accommodated without adversely affecting the circuit area RA of the sheet substrate FB. As a result, the handling ability of the sheet substrate FB can be enhanced.

Furthermore, the substrate accommodation apparatus 100 of the present embodiment includes a rotation driving mechanism 111 as the winding mechanism which winds the sheet substrate FB having the circuit area RA, in which the circuit manufacturing process is performed, around the shaft portion 2, and a case transportation mechanism 116 which accommodates the shaft portion 2 with the sheet substrate FB wound thereon in the cover portion 3. Thus, the sheet substrate FB can be smoothly accommodated in the substrate case 1. As a result, the handling ability of the sheet substrate FB can be enhanced.

The technical range of the present invention is not limited to the above-mentioned embodiment, but can be suitably modified within the range without departing from the gist of the present invention.

In the above-mentioned embodiment, a description has been given of the configuration in which the sheet substrate FB is wound around the shaft portion 2 in a state where the shaft portion 2 is separated from the cover portion 3, but a configuration, in which the sheet substrate FB is wound around the shaft portion 2 in the state where, for example, the shaft portion 2 is integrated with the cover portion 3, may be adopted without being limited thereto.

Figure 12A:
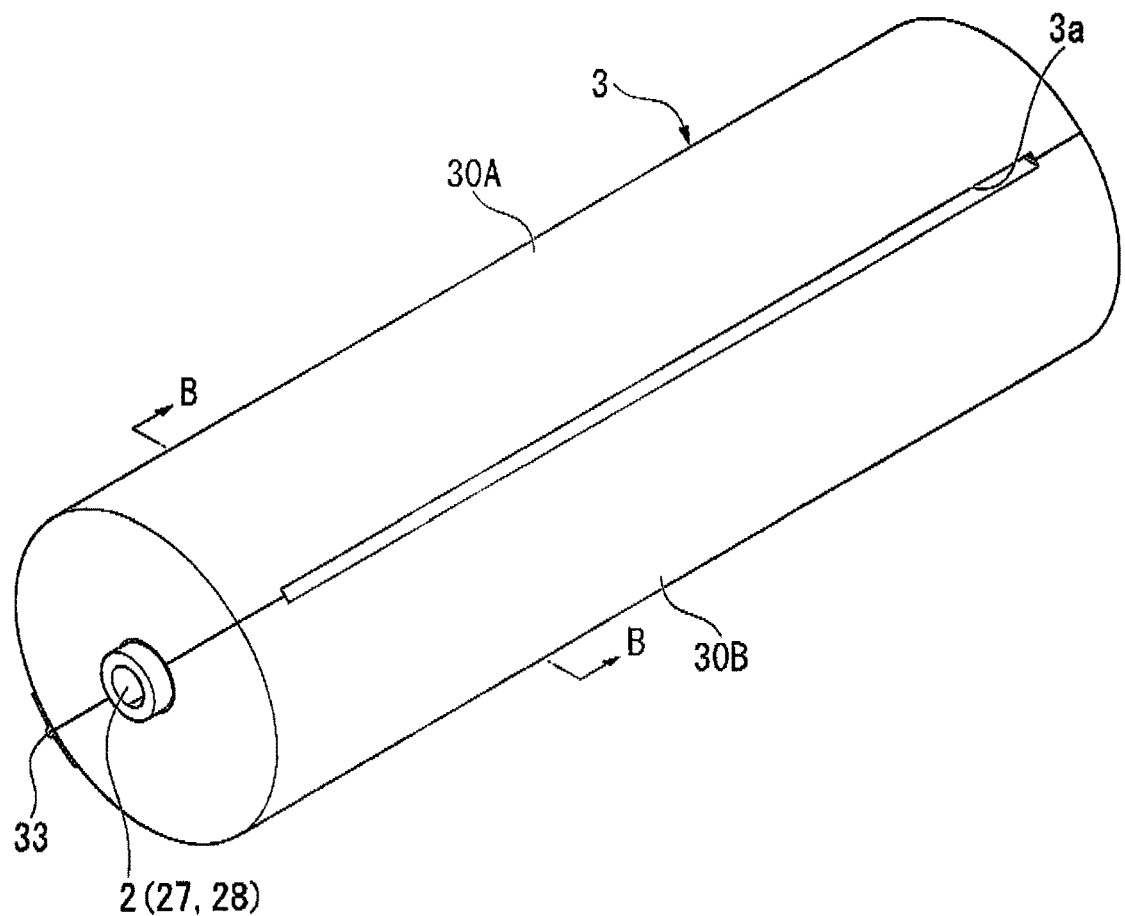
FIG. 12A is a perspective view that shows another configuration of a substrate case according to the present invention.

In this case, for example, as shown in FIG. 12A, it is possible to adopt a configuration in which the opening portion 3a is provided in the cover portion 3. The cover portion 3 has a configuration in which the cover member 30A and the cover member 30B are connected to each other, for example, via the hinge portion 33 and the opening portion 3a is disposed in an opening and closing boundary portion between the cover member 30A and the cover member 30B. Furthermore, the end portion of the cover portion 3 is in a state where the connection object portions 27 and 28 of the shaft portion 2 are exposed. For this reason, it is possible to connect the cover portion 3 and the shaft portion 2 in the integrated state to an external connection portion (e.g., the rotator 111a, the mover 116a or the like).

Figure 12B:
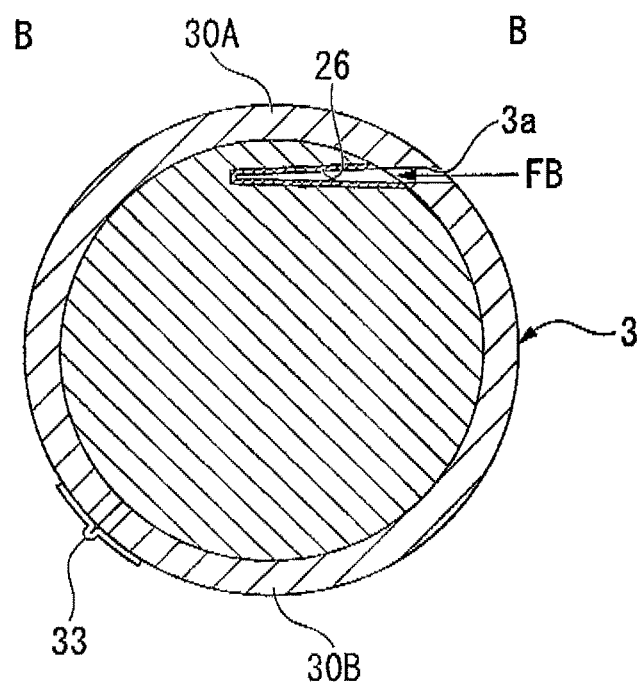
FIG. 12B is a cross-sectional view that shows another configuration of a substrate case according to the present invention.

FIG. 12B is a diagram that shows the shape along the section B-B of FIG. 12A. As shown in FIG. 12B, in the shaft portion 2, a slot portion 26 is provided in the position corresponding to the opening portion 3a. In addition, the slot portion 26 is formed from the surface of the shaft portion 2 to the inner portion thereof, but is formed so as to slightly deviate from the center of the shaft portion 2. In this case, upon winding the sheet substrate FB, it is possible to lower the angle of the fold mark which is formed in the winding start portion FH of the sheet substrate FB. As a result, for example, even if the perforation M as in the above-mentioned embodiment is not formed, the sheet substrate FB can be smoothly wound without the formation of unevenness.

In addition, the arrangement of the opening portion 3a is not limited to the configuration shown in FIGS. 12A and 12B and, for example, may be any position on the cover member 30A and the cover member 30B.

Furthermore, in the present embodiment, a description has been given of the configuration in which the sheet substrate FB having a circuit area RA, in which the circuit process was performed, is accommodated in the substrate case 1. The sheet substrate FB that is accommodated in the substrate case 1 may be one (a finished product) having a circuit area RA in which all the circuit processes constituting the display device are performed, or may be a circuit area RA (a middle product) in which a portion of all the circuit processes is performed.

In addition, in the present embodiment, the substrate cutting portion 104 is installed in the substrate carrying portion 101 but may be installed in the accommodating processing portion 102. For example, the substrate cutting portion 104 may be installed at the downstream side of the transport direction of the front portion 106a among the accommodating processing portion 102.

Furthermore, the cover member 30 of the substrate case 1 in the present embodiment was formed in the shape of a cylinder, but may be formed in the shape of a square pillar without being limited to the cylinder shape.

Moreover, the substrate case 1 in the present embodiment has been described as having the configuration in which one sheet substrate FB is accommodated in a single case, but two or more sheet substrates FB may be accommodated in the one case with or without being cut.

The invention claimed is:

1. A substrate case comprising:
a shaft portion including a holding portion that detachably holds and contacts one end portion of a sheet-shaped substrate on which a display element is formed, a first portion, a second portion opposite to the first portion, and a rib portion disposed between the first portion and the second portion and including a plurality of ribs, each of the ribs including a curved side surface curved in a ring shape around a substantially entire circumference of the surface of the shaft portion, the curved side surfaces of the ribs contacting with a surface of the sheet-shaped substrate, and the curved side surfaces of the ribs being separate from each other in a longitudinal direction and a circumferential direction of the shaft portion; and
a cover portion that is openable and closable and is attached to the shaft portion and to accommodate the sheet-shaped substrate in a state where the one end portion of the sheet-shaped substrate is held by the holding portion of the shaft portion and where the sheet-shaped substrate is wound around the rib portion of the shaft portion and is rolled.

2. The substrate case according to claim 1,
wherein the holding portion has a slot portion that is formed from a surface of the first portion, a surface of the second portion and the curved side surfaces of the ribs toward the inside of the shaft portion; and
wherein the slot portion is formed so as to extend in an axial direction of the shaft portion.

3. The substrate case according to claim 2,
wherein a gap of the slot portion gradually narrows from the surface of the first portion, the surface of the second portion, and the curved side surfaces of the ribs toward the inside of the shaft portion.

4. The substrate case according to claim 3,
wherein the slot portion is provided at a plurality of positions around the surface of the first portion, the surface of the second portion, and the curved side surfaces of the ribs.

5. The substrate case according to claim 2,
wherein the shaft portion has a connection portion which connects the first portion, the second portion, and the rib portion along the longitudinal direction of the shaft portion; and
wherein the slot portion is formed at the connection portion.

6. The substrate case according to claim 2, wherein the curved side surfaces of the ribs are separated by the slot portion in the circumferential direction of the shaft portion.

7. The substrate case according to claim 1,
wherein the holding portion has a fixing pin that fixes a winding start portion of the substrate to the surface of the first portion and the surface of the second portion.

8. The substrate case according to claim 7,
wherein the shaft portion has a connection portion which connects the first portion, the second portion, and the rib portion.

9. The substrate case according to claim 1, further comprising:
a fixing portion that fixes an area different from the end portion of the substrate to at least one of the shaft portion or the cover portion in the state of the substrate being wound around the surface of the first portion, the surface of the second portion, and the curved side surfaces of the ribs.

10. The substrate case according to claim 9,
wherein the fixing portion has a clamp mechanism, and wherein the clamp mechanism pinches the substrate together with at least one of the surface of the first portion or the surface of the second portion.

11. The substrate case according to claim 1,
wherein at least one of the first portion or the second portion has a connection object portion that is connected to at least one of a driving mechanism for driving the shaft portion or a transportation mechanism for transporting the shaft portion.

12. The substrate case according to claim 1,
wherein the cover portion has a shaft holding portion that holds the shaft portion.

13. The substrate case according to claim 12,
wherein the shaft holding portion has an exposure portion that exposes a part of the first portion and the second portion of the shaft portion.

14. The substrate case according to claim 1,
wherein the cover portion has an opening portion through which the substrate passes.

15. The substrate case according to claim 1,
wherein the cover portion has a lid portion that can be opened and closed, and a hinge portion provided between the first portion and the second portion of the shaft portion with respect to the longitudinal direction of the shaft portion.

16. The substrate case according claim 15,
wherein the lid portion is formed so as to allow the shaft portion to be inserted or removed through the cover portion.

17. The substrate case according to claim 15, further comprising:
a closed state holding portion that holds the closed state of the lid portion.

* * * * *